United States Patent
Loo et al.

(10) Patent No.: US 7,056,765 B2
(45) Date of Patent: Jun. 6, 2006

(54) SEMICONDUCTOR DEVICE PACKAGE AND METHOD OF MANUFACTURE

(75) Inventors: Kum-Weng Loo, Singapore (SG); Chek-Lim Kho, Singapore (SG)

(73) Assignee: STMicroelectronics Asia Pacific Pte Ltd., Singapore (SG)

( * ) Notice: Subject to any disclaimer, the term of this patent is extended or adjusted under 35 U.S.C. 154(b) by 0 days.

(21) Appl. No.: 10/712,981

(22) Filed: Nov. 13, 2003

(65) Prior Publication Data
US 2004/0159927 A1 Aug. 19, 2004

(30) Foreign Application Priority Data
Nov. 15, 2002 (SG) ............... 200206897-1

(51) Int. Cl.
*H01L 21/44* (2006.01)
*H01L 23/28* (2006.01)
(52) U.S. Cl. ............ 438/106; 438/125; 438/126; 438/127; 257/787
(58) Field of Classification Search ................ 438/14, 438/15, 26, 106, 107, 110, 119, 127, 112, 438/125–126; 257/100, 433, 434, 667, 787–796, 257/678, E31.117, E31.118, E51.02, E23.116, 257/E23.14
See application file for complete search history.

(56) References Cited

U.S. PATENT DOCUMENTS

| 5,049,526 | A | * | 9/1991 | McShane et al. ............. 29/827 |
| 5,223,739 | A | | 6/1993 | Katsumata et al. ......... 257/676 |
| 5,468,910 | A | | 11/1995 | Knapp et al. ............... 174/52.2 |
| 5,637,916 | A | * | 6/1997 | Joshi .......................... 257/668 |
| 5,692,296 | A | * | 12/1997 | Variot ......................... 29/827 |
| 5,895,229 | A | * | 4/1999 | Carney et al. .............. 438/106 |
| 5,897,338 | A | | 4/1999 | Kaldenberg ................. 438/116 |
| 5,923,959 | A | * | 7/1999 | Mess .......................... 438/126 |
| 5,963,782 | A | | 10/1999 | Webb .......................... 438/15 |
| 6,255,728 | B1 | | 7/2001 | Nasiri et al. ................ 257/704 |
| 6,323,550 | B1 | | 11/2001 | Martin et al. ............... 257/704 |
| 6,331,452 | B1 | | 12/2001 | Gall ............................ 438/127 |
| 6,351,996 | B1 | | 3/2002 | Nasiri et al. .................. 73/706 |
| 6,432,742 | B1 | * | 8/2002 | Guan et al. ................. 438/106 |
| 6,933,175 | B1 | * | 8/2005 | Lo et al. ..................... 438/122 |

* cited by examiner

*Primary Examiner*—Jasmine Clark
(74) *Attorney, Agent, or Firm*—Lisa K. Jorgenson; E. Russell Tarleton; Seed IP Law Group PLLC

(57) ABSTRACT

A semiconductor package having a substrate; a semiconductor die attached to the substrate; a housing attached to the substrate and arranged to surround the semiconductor die; and solidified molding material arranged around the housing and adhering to the substrate to secure the housing in position on the substrate. A method of manufacturing the package is also disclosed.

18 Claims, 9 Drawing Sheets

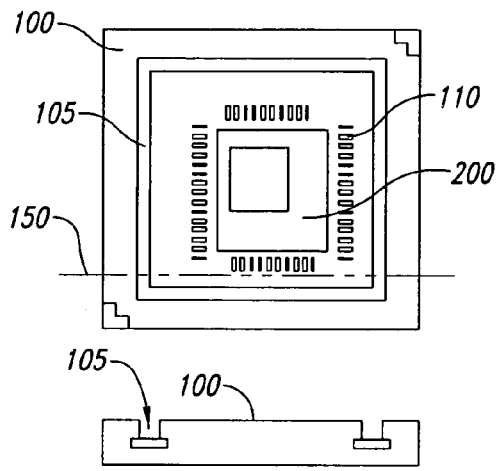
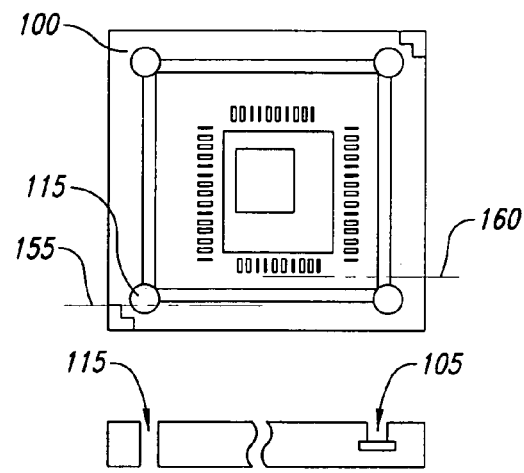
FIG. 1A  FIG. 1B
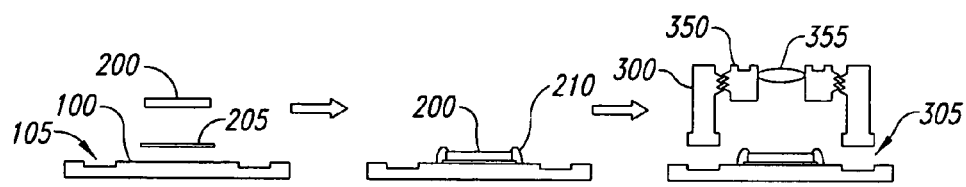
FIG. 2A  FIG. 2B  FIG. 2C
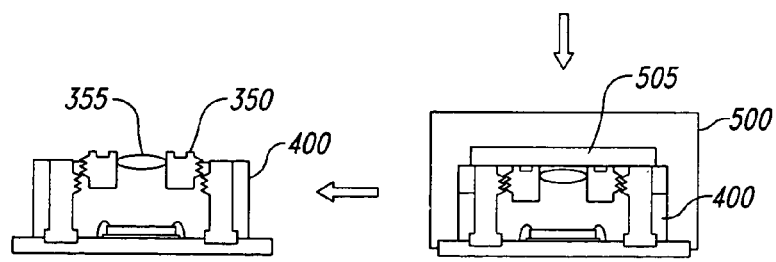
FIG. 2E  FIG. 2D

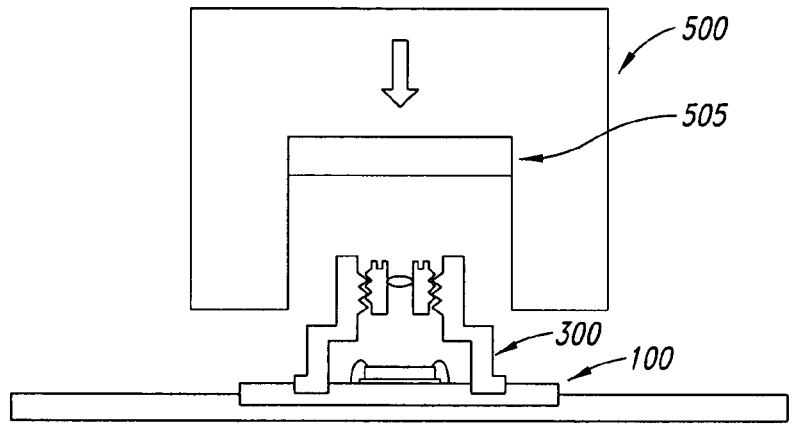
FIG. 3
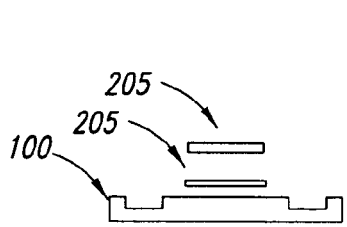
FIG. 4A    FIG. 4B
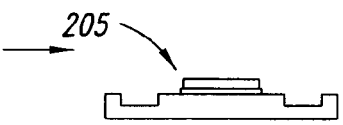
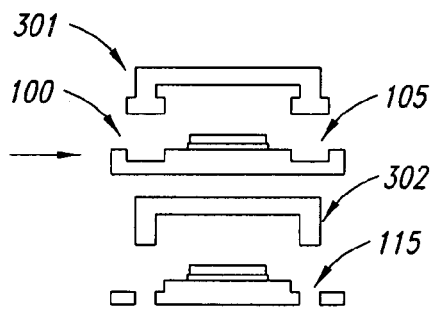
FIG. 4C
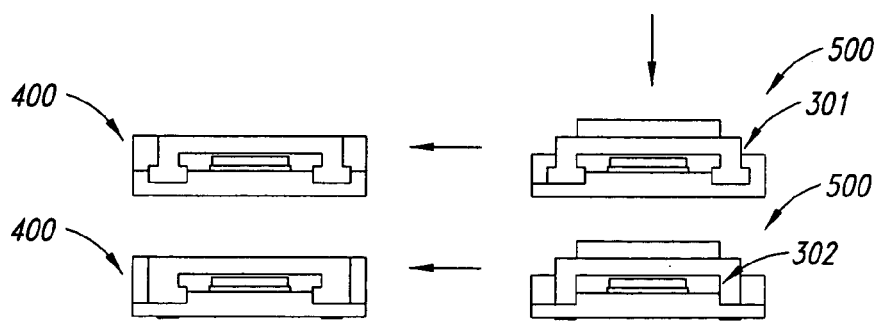
FIG. 4E    FIG. 4D

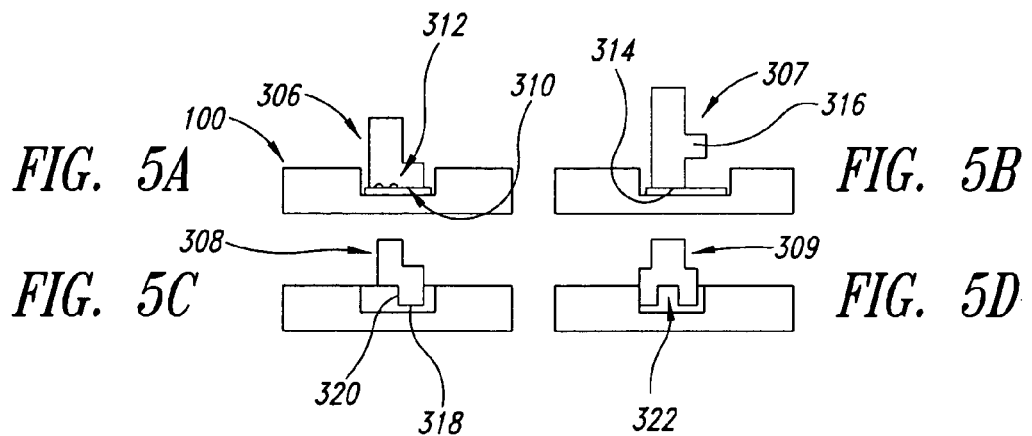
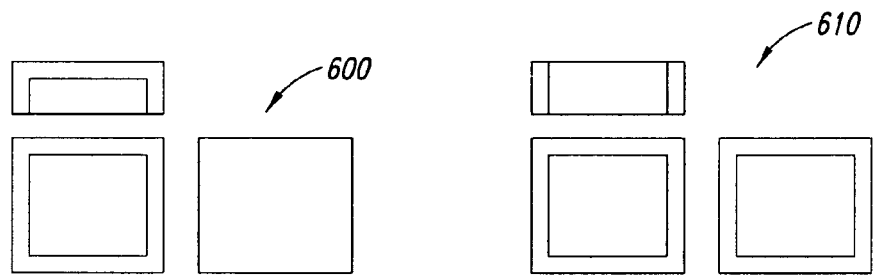

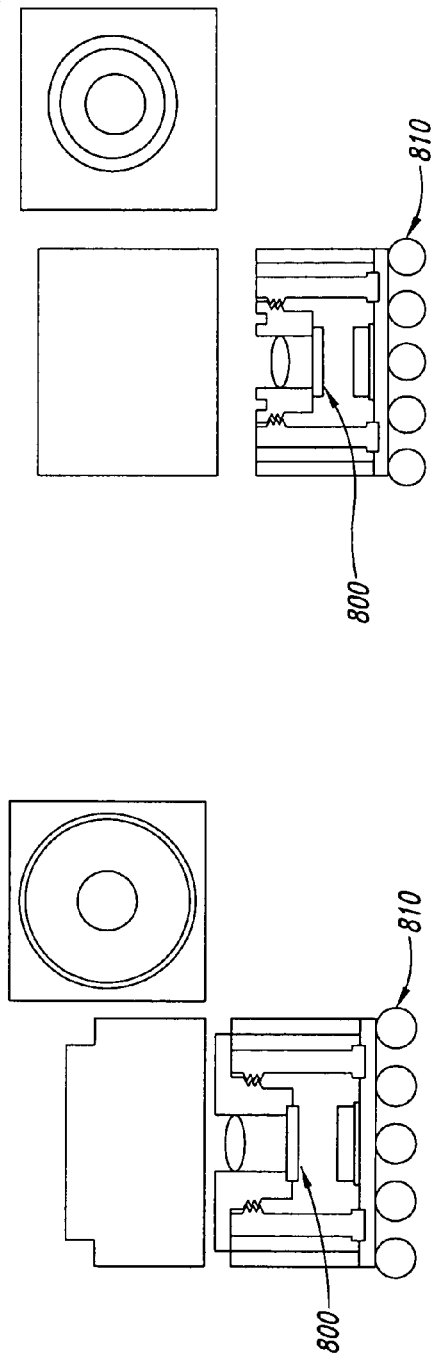
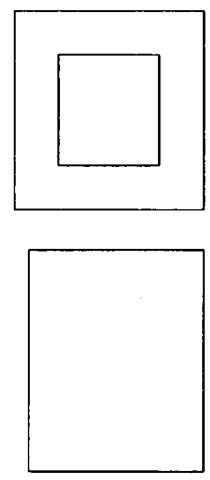
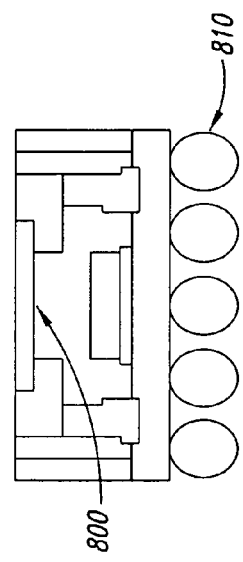
FIG. 11A
FIG. 11B
FIG. 11C

SEMICONDUCTOR DEVICE PACKAGE AND METHOD OF MANUFACTURE

BACKGROUND OF THE INVENTION

1. Field of the Invention

The present invention relates to a method of packaging a semiconductor device. It finds particular utility with devices such as image sensors, MEMs, and pressure sensors.

2. Description of the Related Art

Semiconductor sensor packages generally include a semiconductor die part that is mounted on a substrate made of metal or plastic or a combination thereof, with the die and substrate being enclosed within a plastic material. However, since sensor semiconductors must be capable of being exposed to, e.g., light, in the case of optical sensors, or a fluid, in the case of pressure sensors, the active die surface must be left exposed, or at least accessible, after the die and substrate have been enclosed.

Prior art packaging techniques often use a ceramic substrate material, which is preconfigured with a cavity to accept the die. Such ceramic substrates are in single unit form, they cost more than substrates made of metal or plastic or a combination thereof.

Once the die is attached to the substrate, a cap is applied to protect the die surface and to seal the unit. Prior art techniques attach a cap to the substrate, the leadframe or the die surface. The cap is held in place using an adhesive. The adhesive is usually in the form of a paste or it is dispensed from a tape. However, the application of adhesive in either form is difficult, prone to result in adhesive being erroneously applied to the die surface and requires lengthy periods for the adhesive to cure.

Another technique which is used to protect the die surface while the package is enclosed in a molding material uses a soft deformable insert that is placed over the die while molding material is injected to enclose the entire package. Later, once the molding material has set, the insert is removed, leaving a raised edge of molding material around the die. However, there is a risk that the delicate die surface can be damaged by the insert either at the preparation or the removal stage. Insertion and removal are also additional steps in the manufacturing process that require more time, additional machinery, and increase the opportunity for error.

BRIEF SUMMARY OF THE INVENTION

According to a first aspect of the present invention, there is provided a semiconductor package including: a substrate; a semiconductor die attached to the substrate; a housing part attached to the substrate and arranged to surround the semiconductor die; and solidified molding material arranged around the housing and adhering to the substrate to secure the housing in position on the substrate.

Preferably, the semiconductor die is attached to the substrate by means of an adhesive substance.

Preferably, the substrate includes a channel arranged on its upper surface for receiving a portion of the housing part.

Preferably, a portion of the housing part is arranged to penetrate the substrate.

Preferably, the substrate is formed from an epoxy material. In a preferred form, the epoxy is FR4/5 or BT, although other epoxies may be used.

Alternatively, metal, ceramic or other materials may be used as required.

Preferably, the housing part is formed from a thermoplastic or thermosetting material. Other materials may be used as required, with the proviso that the melting temperature of the chosen material should be higher than the temperature of the molding material used.

Preferably, the package additionally includes an insert for attachment to the housing part.

Preferably, the insert is provided with a screw thread for co-operation with a complementary thread provided in the housing part.

Alternatively, the insert is arranged to provide a snap-fit connection with the housing part.

Preferably, the insert includes a lens, and the lens is arranged such that it is positioned above the semiconductor die.

Preferably, the insert includes a channel for allowing the through-flow of a fluid such that the fluid is able to contact an active portion of the semiconductor.

Preferably, the active portion of the semiconductor is sealed from the remainder of the housing by a sealing material.

Preferably, the insert is provided with a channel for allowing the through-flow of a cooling material, and the insert is arranged to be thermally coupled to the semiconductor to facilitate the cooling of the semiconductor.

Preferably, the insert includes a thermally conductive material and includes a plurality of cooling fins, and the insert is thermally coupled to the semiconductor.

Preferably, the portion of the housing part that contacts the substrate is substantially flat and includes a channel inscribed in the flat portion.

In a second aspect of the present invention, there is provided a method of manufacturing a semiconductor device, including the steps of:

attaching a semiconductor die to a substrate;

positioning a housing part on the substrate, in a position surrounding the die;

positioning a mold over the housing part such that an upper surface of the housing part abuts against an inner surface of the mold; and injecting into the mold a molding material.

Preferably, the method further includes the step of wire bonding the semiconductor die to selected pads on the substrate.

Preferably, the step of attaching a semiconductor die to a substrate includes the step of applying an adhesive substance to the substrate prior to applying the semiconductor die.

Preferably, the step of injecting a molding material includes the step of bringing the molding material to a temperature in the range of 160° C.–185° C. and a pressure of 75 bar (±10%) before it is injected into the mold.

Alternatively, different temperatures and pressures may be required, depending on the choice of housing and molding materials.

Preferably, the step of positioning the housing includes positioning the housing in a channel that surrounds the semiconductor die.

Preferably, the step of positioning the housing includes the step of having part of the housing penetrate part of the substrate.

Preferably, the inner surface of the mold is arranged to be deformable such that a tight fit against the upper surface of the housing is achieved.

In accordance with another embodiment of the invention, a semiconductor device is provided that includes a substrate having a semiconductor die attached thereto; a housing have a sidewall surrounding an open interior that is in communication with a first open end and with a second end that is closed in the sidewall, the first open end sized and shaped to circumscribe the channel, the second end having an opening formed therein to enable fluid communication with the open interior; and a molding material affixed to the substrate and to the housing to hold the housing in place and to seal the housing to the substrate to prevent fluid communication between the sidewall of the housing and the substrate.

In accordance with a further embodiment of the invention, a semiconductor device is provided that includes a substrate having a semiconductor die attached to a surface thereof; a housing having a sidewall surrounding an open interior that is in communication with a first open end and a second open end of the sidewall, the first open end sized and shaped to circumscribe the semiconductor die; an adaptor configured to be received in the second open end of the housing and to expose an active portion of the semiconductor die to at least one of light, fluid, fluid pressure, and fluid temperature without damaging or altering the semiconductor die adjacent the active area of the semiconductor die; and molding material affixed to the substrate and the housing to hold the housing in place and to seal the housing to the substrate to prevent fluid communication between the sidewall and the substrate.

In accordance with still yet another embodiment of the invention, a semiconductor device is provided that includes a substrate having a semiconductor die attached thereto and a channel formed in the substrate circumscribing the semiconductor die; a housing having a sidewall surrounding an open interior that is in communication with a first open end and a second open end of the sidewall, the sidewall positioned in the channel and configured to be sized and shaped to be slideably received within the channel; an adaptor configured to be received in the second open end of the housing and to expose an active portion of the semiconductor die to at least one of light, fluid, pressure, and temperature without damaging or altering the semiconductor die adjacent the active area of the semiconductor die; and a molding material affixed to the substrate and the housing to hold the housing in place and to seal the housing to the substrate.

BRIEF DESCRIPTION OF THE DRAWINGS

For a better understanding of the present invention and to understand how the same may be brought into effect, the invention will now be described by way of example only, with reference to the appended drawings in which:

FIGS. 1A and 1B show top plan and side views of two substrate configurations according to embodiments of the invention;

FIGS. 2A–E show the steps in the assembly of a packaged semiconductor according to an embodiment of the invention;

FIG. 3 shows a partially assembled semiconductor package prior to being placed in a mold;

FIGS. 4A–E show the steps in the assembly of semiconductor packages in accordance with embodiments of the invention;

FIGS. 5A–D show housing terminations in accordance with embodiments of the invention;

FIGS. 6A–D show side, top plan and bottom plan views of housings according to embodiments of the invention;

FIGS. 11A–E show various embodiments of the invention including a filter element, and also an alternative mounting means using a flexi-circuit;

DETAILED DESCRIPTION OF THE INVENTION

Figure 7A:
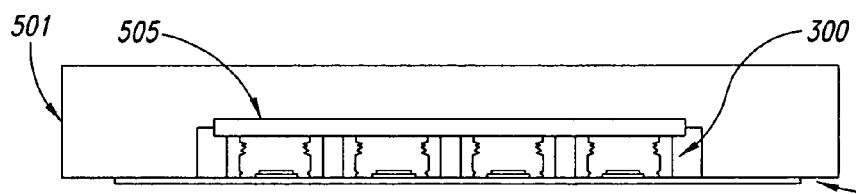
FIGS. 7A–C show steps in the assembly of a matrix of semiconductor packages in accordance with an embodiment of the invention.

FIG. 1A shows a top plan and side view of a substrate 100 including an attached semiconductor die 200. The substrate is preferably composed of an epoxy material such as FR4/5 or BT. The semiconductor die 200 is attached to the surface of the substrate using a suitable adhesive such as an epoxy based adhesive. Immediately surrounding the semiconductor die 200 is a series of electrical contact pads 110. The pads 110 are arranged to be electrically connected in a manner that ultimately allows electrical signals to be sent and received by the semiconductor die. The pads may, for instance, be connected to a series of solder balls on the lower surface of the substrate that are arranged to allow the package to be secured to a circuit board. Toward the outer edge of the substrate 100 surface, outside the pads 110, is a shallow channel 105. This channel 105 is intended to receive the lower surface of a housing part, which is added to enclose the semiconductor die 200. The side view of FIG. 1A is shown taken along line 150.

FIG. 1B shows a similar top plan and side view of a further substrate. In this embodiment, the square channel 105 is supplemented at each corner by a hole 115 that completely penetrates the substrate 100.

The side view is a split view with the left half showing a view along line 155, while the right side shows a view along line 160.

FIGS. 2A–2E show some of the steps involved in the assembly of a complete semiconductor package according to an embodiment of the invention. FIG. 2A shows a substrate 100 with a channel 105 as previously described in relation to FIG. 1A. Using automated pick and place machinery, a semiconductor die 200 is attached to a central portion of the substrate 100 using an adhesive 205. The adhesive 205 may be pre-applied to the substrate in the form of a film, or may be dispensed in paste or liquid form prior to the placing of the die 200. The next stage, shown in FIG. 2B, is the attachment of bonding wires 210. These are again placed using known automated processes. The bonding wires are connected between the pads 100 on the substrate and similar pads on the upper surface of the die. The bonding wires may be gold, copper or any other suitably conductive material.

FIG. 2C shows the positioning of the housing 300. The particular product illustrated in FIGS. 2A–2E are an optical sensor. FIG. 2C shows that the housing 300 includes an adaptor 350 which further includes a lens 355. The housing and adaptor are placed such that the lower surface 305 sits in the channel 105 in the substrate surface. The housing is merely placed in the channel at this stage and is not attached using adhesive.

FIG. 2D shows the introduction of a mold 500 which fits tightly over the housing 300 such that the upper surface of the housing 300 abuts against the inner surface 505 of the mold 500. The inner surface 505 of the mold may be composed of a material different than the rest of the mold so that it may deform slightly to ensure a tight fit. Once the mold is securely in place, a molten molding material 400 is injected in to the mold. A suitable material 400 is a thermosetting plastic material, and it may be injected at a temperature of approximately 160° C.–185° C. and a pressure of approximately 75 bar. The housing 300 and adaptor 350 are composed of a material having a suitably high melting point to ensure that they are not damaged by the molding process.

FIG. 2E shows the completed package once it is removed from the mold 500. The adaptor 350 is shown in a slightly raised position from that in which it entered the mold. The adaptor 350 is raised or lowered using the integral screw thread as shown. The molding material 400 forms a solid enclosure for the adaptor which has the effect of securing the housing 300 to the substrate 100.

During the molding process, the inclusion of the adaptor 350 in the housing 300, ensures that no molding material 400 can contaminate or damage the sensitive die surface 200.

FIG. 3 shows a detailed view of the mold 500 being positioned above the semiconductor device. The depth of the mold is selected carefully to ensure that a tight fit around the housing 300 is achieved. The portion 505 of the mold which abuts directly against the upper surface of the housing 300 may be formed from a material different than the rest of the mold 500 such that it deforms slightly to ensure a tight fit. A suitable material for this portion 505 of the mold is a silicone or rubber material, while the main body of the mold 500 may be formed from hardened steel with a chromium plating.

FIGS. 4A–E show the assembly of two different package types according to further embodiments of the invention. FIGS. 4A and 4B correspond directly to FIGS. 2A and 2B described previously. FIG. 4C shows two different packaging options for a sensor, such as a pressure sensor, which, unlike the previous example, is completely enclosed by a housing 301 or 302. Housing 301 is similar to the housing 300 of FIG. 2C in that it is designed to sit solely within a channel 105 in the substrate. Alternative housing 302 is designed to completely penetrate the substrate in at least one location 115, in the manner described in relation to FIG. 1B.

FIG. 4D shows the alternative housings 301 and 302 in position within the mold 500. FIG. 4E shows the two corresponding completed packages encased in the solid molding material 400.

FIGS. 5A–D show alternative end portions 306, 307, 308, 309 for housing parts 300, 301 that are arranged to sit in a shallow channel 105 in the substrate 100.

End part 306 has a substantially L-shaped cross-section, with the lower flat surface 310 including a pair of concentric grooves 312. When the molding compound 400 comes into contact with the housing 300, if any excess molding material attempts to enter the interior of the housing 300, it will be trapped in one or both of the grooves, thus protecting the interior of the housing and the delicate semiconductor die.

End part 307 includes a flat lower surface 314, and a perpendicular element 316 that protrudes out from the vertical wall of the housing 300. The perpendicular element extends part or all of the way around the exterior wall of the housing 300. When the molding material 400 is applied in the mold, the material fills the gap between underneath the protruding element and forms a 'key' which tends to attach the housing more securely to the substrate 100.

End part 308 has a lower flat surface 318, and a vertical wall 320 which is located to the interior of the lower flat surface 318. This particular design has the advantage that more of the surface of the substrate is exposed to the molding material, thus enhancing the bond between the molding material, the housing and the substrate.

End part 308 operates on the same principle as end part 306 in that there is a single groove 322, of relatively large volume compared to end part 306, running around the lower part of end part 309. Any excess molding material which enters the housing will be trapped in the groove 322.

FIGS. 6A–D illustrate some possible housing designs. The top left figure in each case is a side view; the lower left figure is a bottom plan view; and the lower right figure is a top plan view.

FIG. 6A shows a closed housing 600 that is generally square in plan view. Such a housing may be used for a pressure sensor where the semiconductor die does not need to come into direct contact with the sensed parameter.

FIG. 6B shows an open housing 610 that is generally square in plan view. Such a housing benefits from assembly according to embodiments of the invention in that the open upper surface abuts the interior of the mold and so protects the delicate die. A cap or other closure may be fitted after molding if required.

FIG. 6C shows a semi-closed housing 620 that is generally square in plan view. Extending from the square surface 622 is a raised cylindrical portion 624 which is open at its upper surface 626. Such a housing may be useful for optical sensors or other sensors where physical access is required to the die surface.

FIG. 6D shows an open housing 630 that is generally circular in plan view. In other respects, this housing is similar to the housing of FIG. 6B.

Figure 7B:
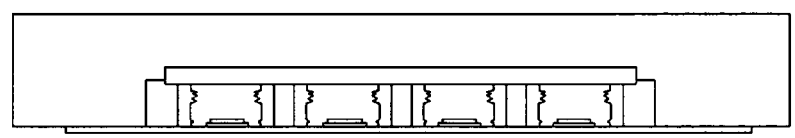
Figure 7C:
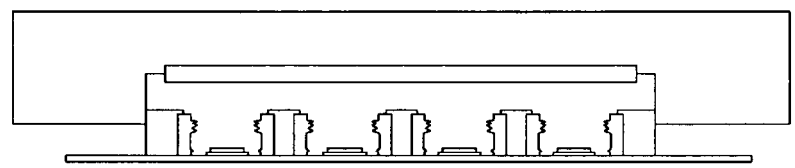
Figure 8:
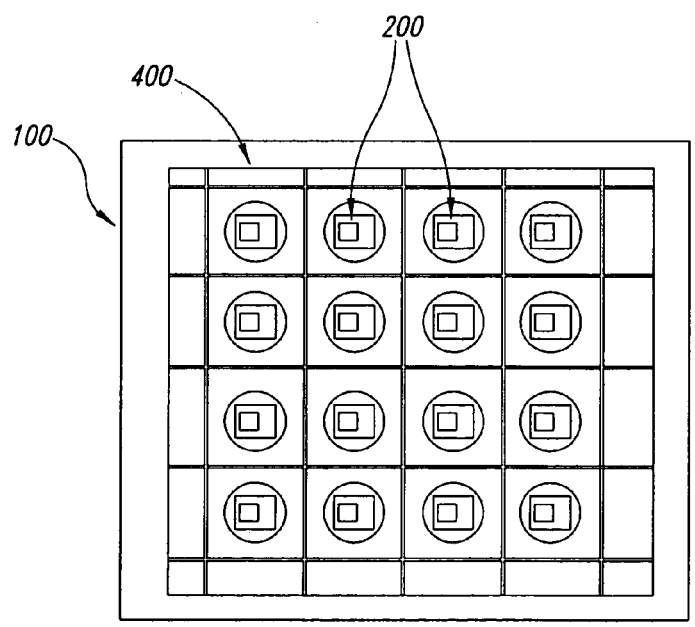
FIG. 8 shows a top plan view of matrix of semiconductor packages produced by the process shown in FIGS. 7A–C.

FIGS. 7A–C illustrate how embodiments of the invention may be used to create arrays of semiconductor packages. FIG. 7A shows a cross-section through a 4×4 array of individual packages based around the housing 300 described in FIGS. 2A–2E. The individual housings 300 are positioned as previously on a substrate. All sixteen housings and associated components are then positioned inside a large mold 501 as previously described. Molten molding material is injected as shown in FIG. 7B. Once the molding material has solidified, as shown in FIG. 7C, the mold may be removed to reveal a matrix of packaged sensor devices. A top plan view of the arrangement is shown in FIG. 8, where the semiconductor dies 200 are visible through the solidified molding material 400 on the substrate 100, prior to the introduction of adaptors 350.

Figure 9:
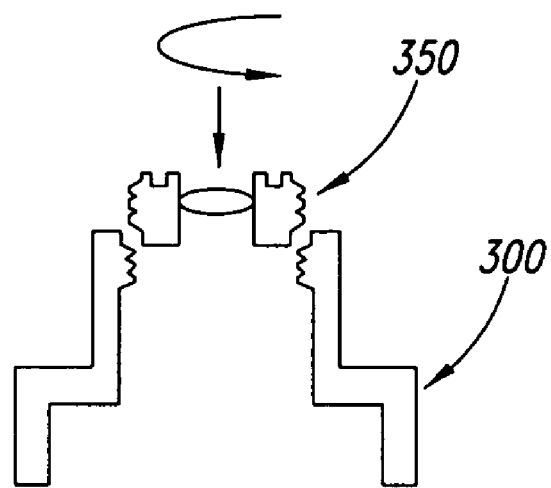
FIG. 9 shows an embodiment of the invention including a screw-mounted insert.

Further embodiments of the invention are presented in FIGS. 9–18. FIG. 9 illustrates the housing 300 already described, and shows how the insert 350, including a lens, attached by means of co-operating screw threads. Such an arrangement allows simple attachment of lenses of different types without any need to alter the basic housing 300.

Figure 10:
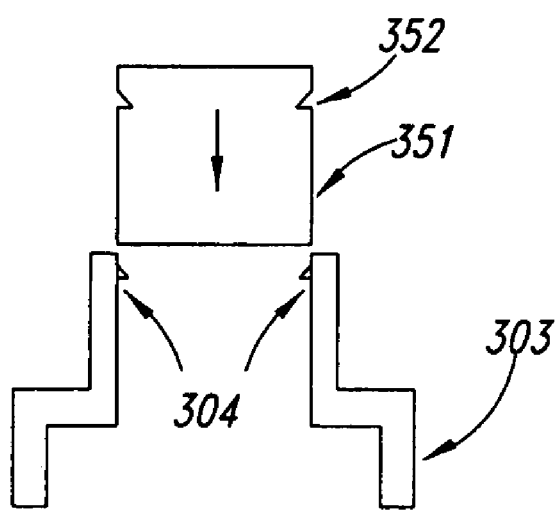
FIG. 10 shows an embodiment of the invention including a snap-fit insert.

FIG. 10 shows an alternative means of attaching an insert 351. In the illustrated embodiment, the insert is a simple plug to seal the housing 303, but other inserts including a lens, for instance, may also be provided. The insert 351 includes one or more recesses about its perimeter. Provided on an inner portion of the housing 303 are one or more projections 304 which co-operate with the recesses 352 to ensure a snap-fit connection between the insert 351 and the housing 303.

FIGS. 11A–E illustrate various embodiments of the invention. In each case, the upper left view is a side view. The upper right view is a top plan view, and the lower left view is a cross-sectional side view.

FIGS. 11A–D show how a filter 800 may be incorporated into the package. Certain die types are susceptible to certain wavelengths of radiation, particularly infra-red (IR) radiation. Each of the embodiments shown in FIGS. 11A–D incorporate a filter adapted to prevent or limit the ingress of IR radiation. In each embodiment illustrated, the filter 800 is incorporated into the housing before the molding process described previously.

FIGS. 11A–D also illustrate the solder balls 810 which are used to fasten the completed package onto a printed circuit board. Individual solder balls allow electrical contact to be made with corresponding contacts on the semiconductor die.

Figure 11E:
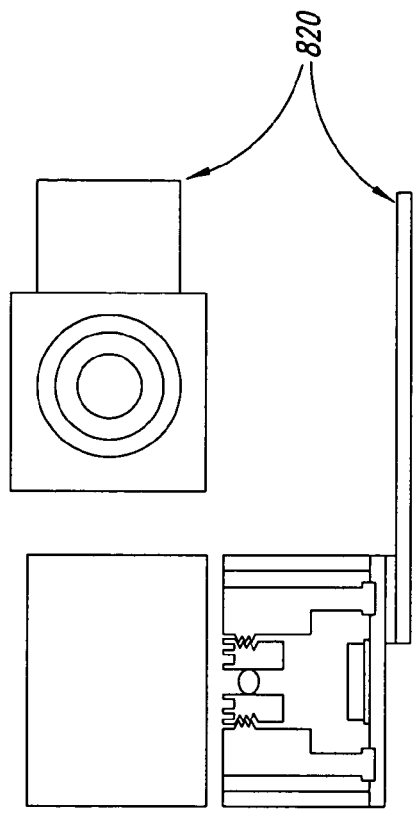
Figure 11D:
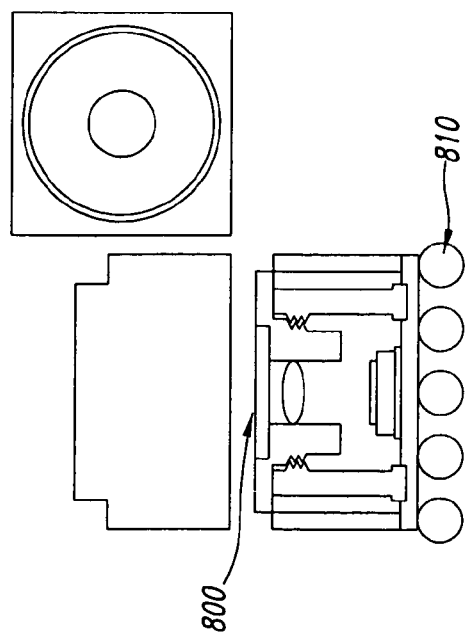

FIG. 11E illustrates a further embodiment of the invention, where rather than using solder balls 810 to secure the package to a circuit board, a length of flexible circuit board 820 is provided which can then be attached either directly to a PCB, or via a socket arrangement.

FIGS. 12–15 illustrate embodiments of the invention which are useful in the provision of packages for sensing properties of fluids, such as temperature, flow rate, pressure or composition.

Figure 12:
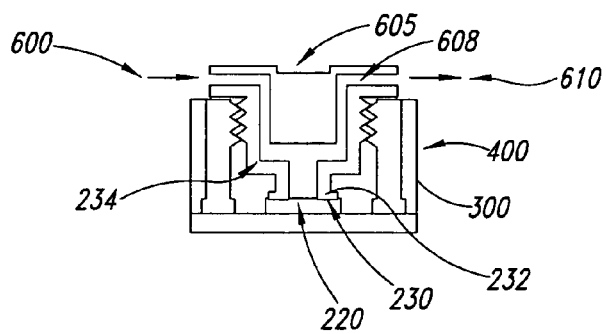
FIG. 12 shows an embodiment of the invention including an insert for allowing fluid sensing.

FIG. 12 shows a housing part 300 formed substantially as previously described, enclosed in solidified molding material 400 which acts to lock the housing part to the substrate as shown. The semiconductor die, located on the substrate, includes an active portion 220 which is sensitive to a particular fluid and is able to sense one or more properties of a fluid.

The housing, rather than having an optical insert as in previous embodiments, has an insert 605 for receiving a fluid (liquid or gas). The insert 605 is attached to the housing 300 by means of a screw thread. There is a channel 608 provided in the insert which allows for a fluid to enter 600 and leave 610. The channel 608 allows the fluid to come into direct contact with the active portion 220 of the semiconductor. The area around the active portion 220 is sealed using a suitable paste, gel, or tape 230 at the base 232 of the insert sidewall 234 to ensure that the fluid does not enter the main body of the housing part 300.

Figure 13:
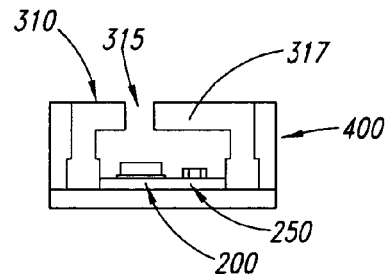
FIG. 13 shows a further embodiment of the invention including an insert for allowing fluid sensing.

FIG. 13 shows an alternative embodiment where the fluid may be allowed to be in contact with the entire interior of the housing 310. Access to the interior is achieved via an aperture 315 in a closed top 317 of the housing 310. Semiconductor 200 is chosen to be sensitive to a property of the fluid under test. Also shown is a passive component 250. The package of FIG. 13 is manufactured in substantially the same way as has been previously described.

Figure 14:
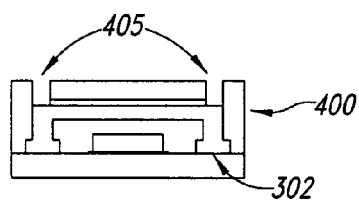
FIG. 14 shows an embodiment of the invention demonstrating the artifacts of ejector pins used in the molding process.

FIG. 14 shows a package including a housing part 302. The solidified molding material includes two recesses 405 in the upper surface. These recesses are formed by ejector pins in the mold, and are used to easily remove the finished package from the mold once the molding material has solidified.

Figure 15:
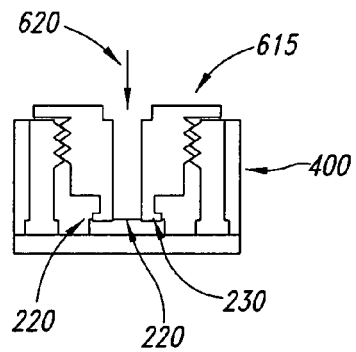
FIG. 15 shows a still further embodiment of the invention including an insert for allowing fluid sensing.

FIG. 15 shows a package including a housing part manufactured as previously described, attached to an insert 615 with a central channel for allowing a fluid 620 to contact the active portion 220 of a semiconductor. The active portion is sealed from the remainder of the housing by use of a sealing paste, gel, or tape 230. Insert 615 is attached to the housing by a screw thread.

Figure 16:
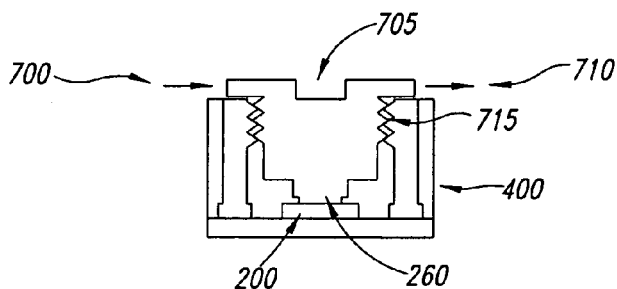
FIG. 16 shows an active thermally cooled embodiment of the invention.
Figure 17:
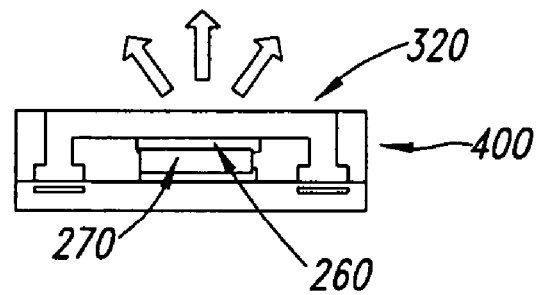
FIG. 17 shows a passive thermally cooled embodiment of the invention.
Figure 18:
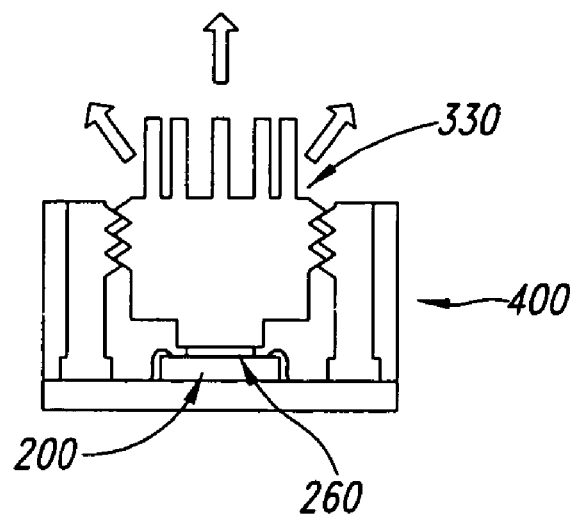
FIG. 18 shows a further passive thermally cooled embodiment of the invention.

FIGS. 16–18 illustrate packages that are adapted to enable efficient thermal management of the included semiconductor. Many semiconductors operate at very high temperatures or are required to be operated at a controlled temperature, and in either case, it is desirable to be able to control their temperatures. This is possible using either active or passive temperature control.

FIG. 16 shows a package including a housing formed as previously described. The semiconductor 200 requires cooling in operation. The insert 705, which is attached by a screw thread 715, is provided with an inlet 700 and an outlet 710 through which a cooling fluid runs. The insert 705 is thermally coupled to the semiconductor 200 via a thermally conductive tape, paste, or gel 260. In this way, the heat generated by the semiconductor is dissipated in the cooling fluid, and the semiconductor is able to operate at a desired temperature. FIG. 16 illustrates an active control technique.

FIG. 17 shows a package including a sealed housing 320 encased in solidified molding material 400 and formed as previously described. This package utilizes passive cooling. The housing 320 is formed from a thermally conductive material, such as a metal, and it is coupled via a thermally conductive material 260 to a semiconductor 270. In this way, the semiconductor 270 is able to radiate heat via the housing 320. The semiconductor 270 in this embodiment is a Ball Grid Array (BGA) type package, and it is noted that this type of package may be used in any of the other embodiments described herein.

FIG. 18 illustrates a further passive cooling device. In this embodiment, the housing includes a screw thread, and mounted to co-operate with said screw thread is an insert 330 formed from a thermally conductive material such as a metal. The insert includes a plurality of cooling fins that act to increase the available surface area for dissipating generated heat. The insert 330 is thermally coupled to semiconductor 200 via a thermally conductive material 260.

Thus, embodiments of the present invention provide a modular system whereby the housing may be simply formed using a molding system, and the same basis housing structure may be adapted to suit a variety of different sensor types.

The present invention includes a novel feature or combination of features disclosed herein either explicitly or any generalization thereof irrespective of whether or not it relates to the claimed invention or mitigates any or all of the problems addressed.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims and the equivalents thereof.

The invention claimed is:

1. A method of manufacturing a semiconductor device, including the steps of:

attaching a semiconductor die to a substrate;

positioning a housing on the substrate, in a position surrounding the die;

positioning a mold over the housing such that an upper surface of the housing abuts against an inner surface of the mold; and injecting into the mold a molding material that is applied only to an exterior of the housing to secure the housing to the substrate.

2. The method of claim 1 further including the step of wire bonding the semiconductor die to selected pads on the substrate.

3. The method of claim 1 wherein the step of attaching a semiconductor die to a substrate includes the step of applying an adhesive substance to the substrate prior to applying the semiconductor die.

4. The method of claim 1 wherein the step of injecting a molding material includes the step of bringing the molding material to a temperature in the range of 160° C.–185° C. and a pressure of 75 bar±10% before it is injected into the mold.

5. The method of claim 1 wherein the step of positioning the housing includes positioning the housing in a channel that surrounds the semiconductor die.

6. The method of claim 1 wherein the step of positioning the housing includes penetrating part of the substrate with a portion of the housing.

7. The method of claim 1 wherein an inner surface of the mold is arranged to be deformable such that a tight fit against the upper surface of the housing is achieved.

8. A method of manufacturing a semiconductor device having a substrate and a die attached to the substrate, the method comprising:

placing a housing on the substrate to cover the die;

positioning a mold over the housing so that the mold bears against the housing; and injecting a molding material into the mold to apply the molding material to only an exterior of the housing to secure the housing to the substrate.

9. The method of claim 8, wherein positioning the mold over the housing comprises urging the mold against the housing to deform at least a portion of the mold.

10. The method of claim 8 further including the step of wire bonding the semiconductor die to selected pads on the substrate.

11. The method of claim 8 wherein the step of injecting a molding material includes the step of bringing the molding material to a temperature in the range of 160° C.–185° C. and a pressure of 75 bar±10% before it is injected into the mold.

12. The method of claim 8 wherein the step of positioning the housing includes positioning the housing in a channel that surrounds the semiconductor die.

13. The method of claim 8 wherein the step of positioning the housing includes penetrating part of the substrate with a portion of the housing.

14. The method of claim 8 wherein an inner surface of the mold is arranged to be deformable such that a tight fit against the upper surface of the housing is achieved.

15. A method of manufacturing a semiconductor device, comprising:

placing a housing on a substrate in a position to surround a semiconductor die on the substrate;

positioning a mold over the housing such that an upper surface of the housing abuts against an inner surface of the mold so that at least a portion of the mold is deformed to achieve a tight fit against the upper surface of the housing; and securing the housing to the substrate by injecting a molding material into the mold to apply the molding material on the exterior of the housing only.

16. The method of claim 15, further comprising wire bonding the semiconductor die to selected pads on the substrate prior to positioning the housing on the substrate.

17. The method of claim 15 wherein positioning the housing includes penetrating part of the substrate with a portion of the housing.

18. The method of claim 15 wherein securing the housing to the substrate by injecting molding material into the mold comprises bringing the molding material to a temperature in the range of 160° C.–185° C. and a pressure of 75 bar±10% before it is injected into the mold.

* * * * *